United States Patent [19]
Chai

[11] Patent Number: 5,761,118
[45] Date of Patent: Jun. 2, 1998

[54] PROGRAMMING APPARATUS FOR ANALOG STORAGE MEDIA

[75] Inventor: Yong-Yoong Chai, Kyungki-do, Rep. of Korea

[73] Assignee: Samsung Electronics Co., Ltd., Suwon, Rep. of Korea

[21] Appl. No.: 768,701

[22] Filed: Dec. 18, 1996

[51] Int. Cl.$^6$ .................................................. G11C 13/00
[52] U.S. Cl. ........................... 365/185.03; 365/185.25
[58] Field of Search ...................... 365/185.03, 185.25, 365/185.33

[56] References Cited

U.S. PATENT DOCUMENTS 5,694,356 12/1997 Wong et al. ................... 365/185.03

Primary Examiner—Terrell W. Fears
Attorney, Agent, or Firm—Jones & Volentine, L.L.P.

[57] ABSTRACT

A programming apparatus for analog storage media such as an E$^2$PROM, which employs a LUT to perform a programming operation and a reading operation at the same time without separation into two operational cycles. The apparatus includes a transistor having a control gate, a floating gate, a source, and a drain, the control gate and source being grounded during a program operation, a Look-up-table which is operatively connected to the drain, a comparator having a non-inverting terminal which is operatively connected to the Look-up-table, a high programming-voltage generator (HPG) having disable terminal connected to an output terminal of the comparator, an adder for adding an output signal of the HPG and an input supply voltage, and for providing a resultant output signal to an inverting terminal of the comparator, and a resistor connected between an output terminal of the HPG and the drain of the transistor.

4 Claims, 2 Drawing Sheets

PROGRAMMING APPARATUS FOR ANALOG STORAGE MEDIA

BACKGROUND OF THE INVENTION

1. Field of the Invention.

The present invention relates to a programming apparatus and method for an analog semiconductor memory device, and in particular, to a programming apparatus and method which writes predetermined data in the analog semiconductor memory device.

2. Description of the Prior Art.

Analog storage media are widely used in which programming data can be electrically erased and rewritten, such as an electrically erasable programming read only memory ($E^2PROM$).

Low operational speeds, however, limit the use of such memory devices. Hence, they have typically been used in low operational speed systems for recording, reproducing, and synthesizing audio signals. The cause of the low operational speed is the memory device requirement of a closed loop process when an analog signal is programmed therein.

FIG. 1 is a circuit diagram showing a construction of conventional programming apparatus having a closed loop for an analog signal. As shown in FIG. 1, in the case where an analog signal is programmed on an $E^2PROM$ storage medium, a high programming-voltage is applied to a drain of a transistor M1 through a resistor R1, while a gate and a source of the transistor M1 is grounded. In such a case, charges accumulate at a floating gate of the $E^2PROM$, and thus a floating gate voltage of the transistor M1 is increased by the accumulated charges. In the conventional programming apparatus, it is necessary to check the voltage level present at the floating gate in order to apply a predetermined programming-voltage to the drain of the $E^2PROM$.

To check the voltage level of the floating gate, a high programming-voltage generator (HPG) 1 is disabled, and a power supply voltage Vdd of 5 V is applied as a normal voltage level to the drain of the transistor M1 through the resistor R1 as shown in FIG. 2.

At this time, a determination is made as to whether the programming operation will be continued or stopped since the desired voltage has been applied to the floating gate in accordance with the drain voltage of the transistor M1.

Such a determination is performed by a comparator 2 which compares an input supply voltage Vin to be programmed with an output voltage Vout of the transistor M1 which is in accordance with the floating gate voltage. If the compared two voltage levels are the same, the HPG 1 is disabled by the output signal of the comparator 2, so that further generation of a programming-voltage is prevented.

Thus, if the output signal of the comparator 2 is varied, the programming operation is stopped. Otherwise, a stored program is read out and then the next programming operation is performed until the output signal of the comparator 2 is inverted.

However, the conventional programming method as described above requires an excessive amount of operation time when analog signal is programmed on the $E^2PROM$.

Specifically, according to the conventional closed-loop type programming method, the programming and reading cycles are segregated from each other as shown in FIG. 2.

The reason underlying segregation of the two cycles is explained below.

As shown in FIGS. 1 and 2, if it is assumed that the programming-voltage is applied to the drain of the transistor M1 through the resistor R1, the charges accumulating at the floating gate cause the threshold voltage of the corresponding gate of the transistor M1 to vary as a result of a Fowler-Nordheim charge-injection mechanism. The variation of the threshold voltage of the gate in turn affects the current flowing through a channel of the transistor M1.

Thus, the channel current of the transistor M1 is affected by the applied voltage Vpp as well as by the threshold voltage caused by the charge injection.

Therefore, in the conventional programming apparatus, since the voltage induced at the floating gate cannot be measured, the voltage variation of the threshold voltage cannot be exactly calculated when the period for a programming operation and the period for a reading operation are not separated from each other.

Further, the conventional programming apparatus requires a repetitive erasing time (Td) for high frequency components from the high programming-voltage in order to protect the $E^2PROM$ whenever the programming-voltage is induced at the HPG 1. Thus, excessive time is needed to perform the above operation.

Also, in the conventional programming system using a feedback loop, since the variation of the output voltage of the transistor M1 is defined as a logarithmic function of the programming pulse period, and precise programming is accomplished by shortening the pulse period, the programming pulse period is limited. Thus, delay of the programming is expected as a result.

Furthermore, an incorrect programming-voltage caused by a non-linear property of the circuit itself, such as an offset voltage of the comparator, will be generated in the commercial programming system.

Consequently, the programming speed of the conventional programming system is greatly limited and the programming apparatus is generally regarded as not having a high reliability.

SUMMARY OF THE INVENTION

Accordingly, it is an object of the present invention to provide a programming apparatus and method for an analog semiconductor memory device which can simultaneously perform both programming and reading operations without separation of the programming and reading cycles.

In order to achieve the above object, the present invention provides a programming apparatus for an analog semiconductor memory device, comprising: a cell transistor having a control gate, a floating gate, a source and a drain, said control gate and said source drain being grounded during a program operation; a high programming-voltage generator having a disable terminal and providing a high programming-voltage for said drain of said cell transistor; a comparative voltage generator for generating a comparative voltage corresponding to a sum of a threshold voltage and said high programming-voltage, said threshold voltage corresponding to a drain voltage of said cell transistor; an adder for adding said high programming-voltage and an input analog voltage, and then outputting a reference voltage; and a comparator for comparing said comparative voltage with said reference voltage, and then disabling said high programming-voltage generator when said comparative voltage is equal to said reference voltage.

In order to achieve the above object, the present invention also provides a programming method for an analog semiconductor memory device comprising: applying a high programming-voltage of a high programming-voltage generator to a drain of a cell transistor, said cell transistor having a control gate, a floating gate, a source and said drain, and said control gate and said source being grounded during a program operation; generating a comparative voltage corresponding to a sum of a threshold voltage and said high programming-voltage, said threshold voltage corresponding to a drain voltage of said cell transistor; adding said high programming-voltage and an input analog voltage, and then outputting a corresponding reference voltage; and comparing said comparative voltage with said reference voltage and then disabling said high programming-voltage generator when said threshold voltage is equal to said input analog voltage.

BRIEF DESCRIPTION OF THE DRAWINGS

The above object, and other features and advantages of the present invention will be become more apparent by the description of the preferred embodiment thereof with reference to the accompanying drawings, in which.

DETAILED DESCRIPTION OF PREFERRED EMBODIMENT

Figure 1:
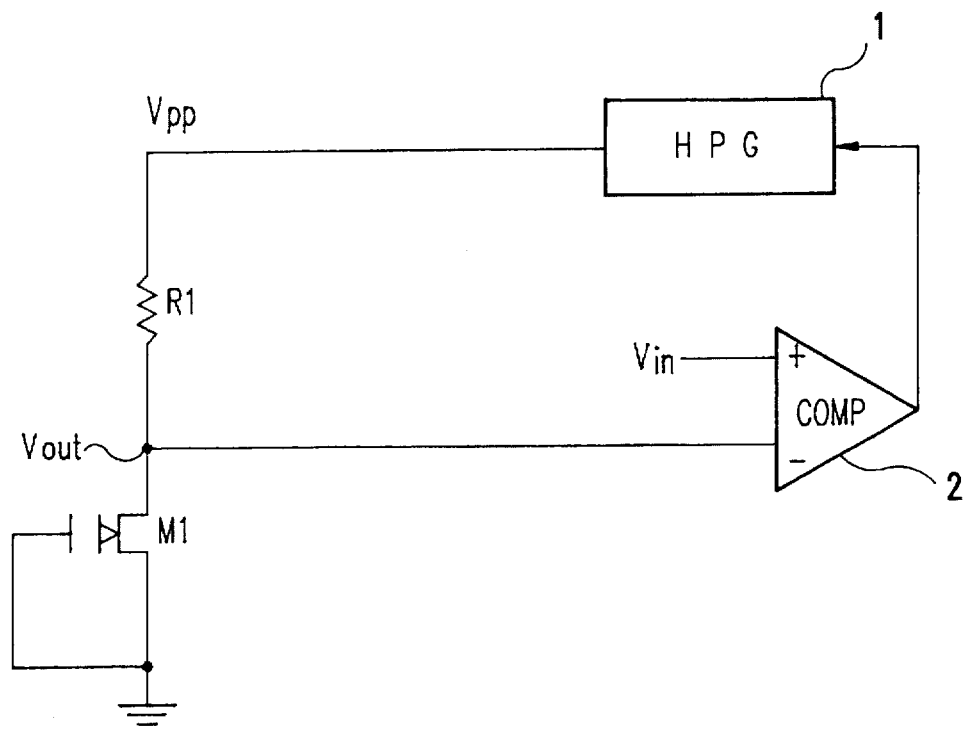
FIG. 1 is a circuit diagram showing the construction of a conventional programming apparatus.
Figure 2:
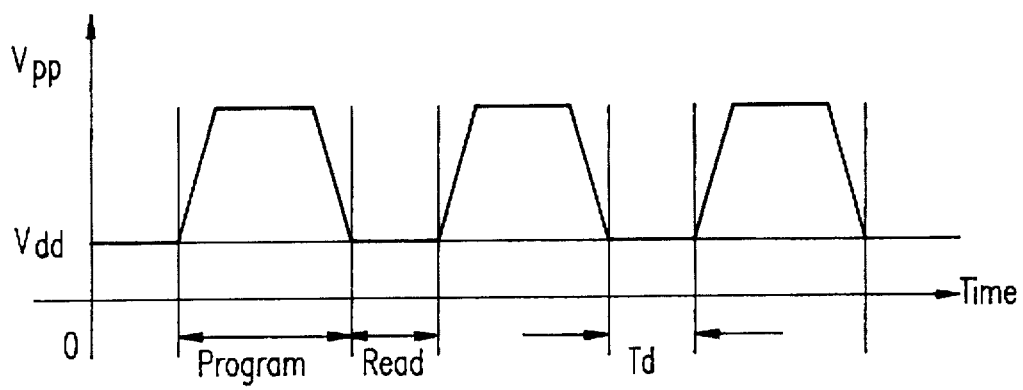
FIG. 2 is a waveform diagram showing a programming-voltage level provided by the conventional programming apparatus.
Figure 3:
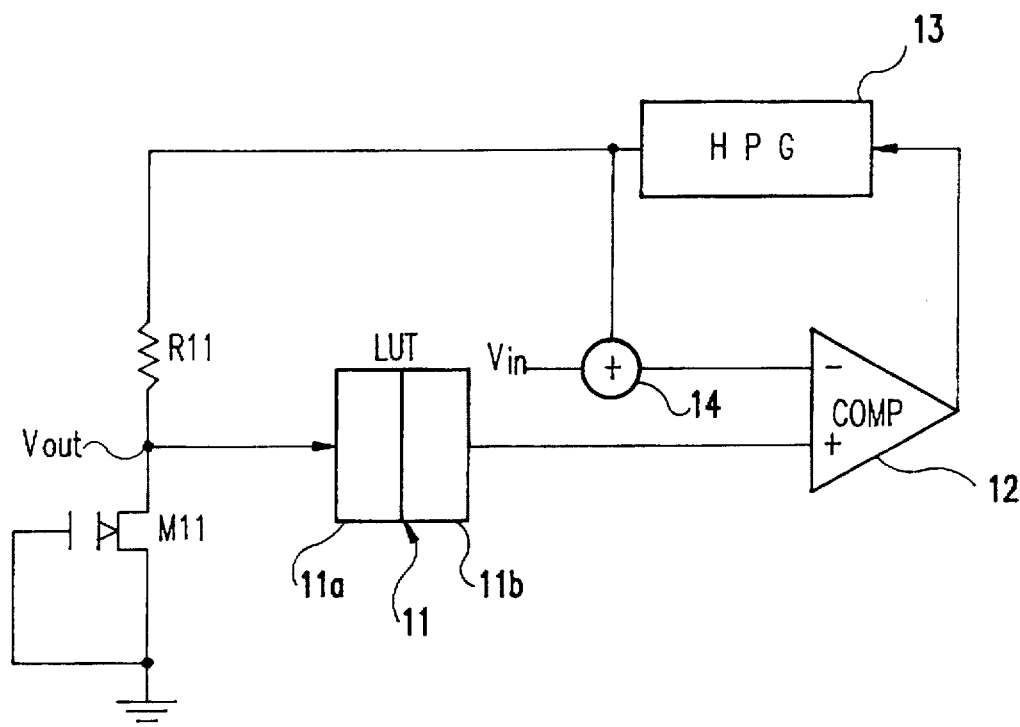
FIG. 3 is a circuit diagram showing the construction of the programming apparatus according to the present invention.

FIG. 3 is a circuit diagram showing the construction of the programming apparatus according to the present invention. Referring to FIG. 3, the present programming apparatus comprises a cell transistor M1 having a control gate, a floating gate, a source, and a drain, the control gate and source being grounded during a program operation; a Look-up-table (LUT) 11 connected to the drain of the transistor M11; a comparator 12 having a non-inverting terminal (+) also connected to the LUT 11; a high programming-voltage generator (HPG) 13 having a disable terminal connected to an output terminal of the comparator 12 and providing a high programming-voltage for the drain of the cell transistor M11; an adder 14 for adding an output signal of the HPG 13 and an input supply voltage Vin, and for providing a resultant output signal to an inverting terminal (−) of the comparator 12; and a resistor R11 connected between an output terminal of the HPG 13 and the drain of the transistor M11.

As a tag address 11A of the LUT 11 is applied the drain voltage Vout of the transistor M11, and the corresponding content 11B of the LUT 11 is applied to the non-inverting terminal (+) of the comparator 12, the thus applied voltage representing a summation of the output voltage Vpp of HPG 13 and a threshold voltage corresponding to the voltage Vout. That is, the LUT 11 functions as a comparative voltage generator for generating a comparative voltage corresponding to a sum of a threshold voltage and the high programming-voltage, and the threshold voltage itself corresponds to the drain voltage of the cell transistor M11.

Figure 4:
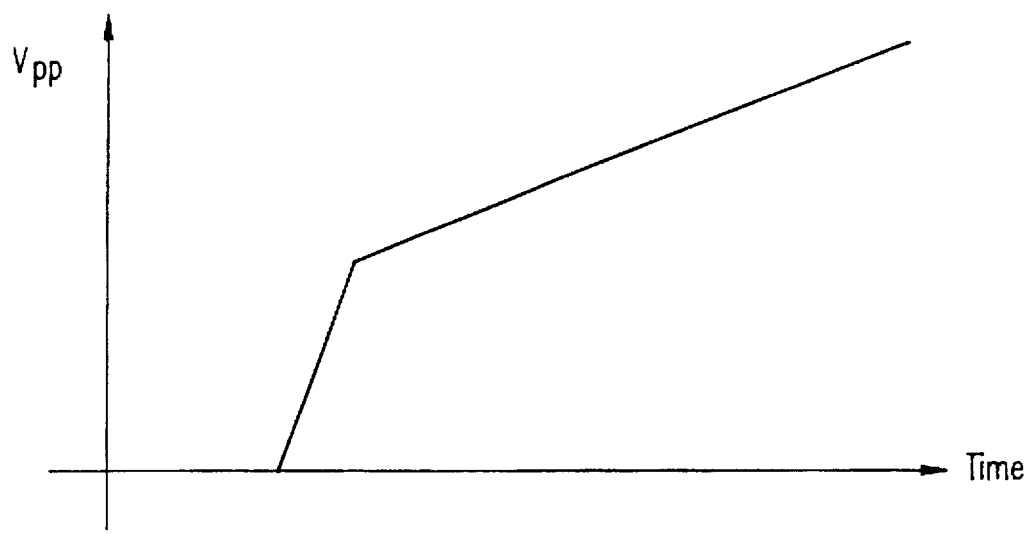
FIG. 4 is a waveform diagram showing a programming-voltage level provided by the programming apparatus according to present invention.

The output voltage of the HPG 13 is illustrated in FIG. 4. If it is assumed that the output voltage Vpp of the HPG 13 as shown in FIG. 4 is applied to the drain of the transistor M11 through the resistor R11, the threshold voltage at a corresponding tag address 11A of the LUT 11 and the output voltage Vpp are applied to the non-inverting terminal (+) of the comparator 12 in accordance with the drain voltage of the transistor M11.

This voltage applied to the non-inverting terminal (+) of the comparator 12 is compared with the adder 14 output voltage which is the sum of the output voltage Vpp and the input supply voltage Vin and which is input to the inverting terminal (−) of the comparator 12.

The comparator 12 thus compares the input supply voltage Vin with the floating gate voltage 10 since the output voltage Vpp is simultaneously applied to both the non inverting terminal (+) and inverting terminal (−) of the comparator 11.

Accordingly, it is not necessary to separate the programming and reading operations according to the present invention which employs a LUT as described above.

If it is assumed that the comparator 12 has an unlimited gain, the inversion of the output signal of the comparator 12 means that the input supply voltage Vin and the threshold voltage are the same. As a result, the programming is completed in such a manner that the inverted output signal of the comparator 12 is applied to the disable terminal of the HPG 13 which generates a high programming-voltage.

As described above, the programming apparatus according to the present invention does not require separating the cycles for the programming and reading operations, and can reduce overhead caused by the ramp rate which essentially occurs when the programming-voltage is synchronized. Further, the pulse period which affects the resolution is not limited. Still further, since the data stored in the LUT is not affected by factors such as a voltage offset generated in the system, the reliability of the programming apparatus is improved.

While the present invention has been described and illustrated herein with reference to the preferred embodiment thereof, it will be understood by those skilled in the art that various changes in form and details may be made therein without departing from the spirit and scope of the invention.

What is claimed is:

1. An apparatus for programming for an analog semiconductor memory, comprising:

a cell transistor having a control gate, a floating gate, a source and a drain, said control gate and said source being grounded during a program operation;

a high programming-voltage generator having a disable terminal and providing a high programming-voltage for said drain of said cell transistor;

a comparative voltage generator for generating a comparative voltage corresponding to a sum of a threshold voltage and said high programming-voltage, said threshold voltage corresponding to a drain voltage of said cell transistor;

an adder for adding said high programming-voltage and an input analog voltage, and then outputting a reference voltage; and a comparator for comparing said comparative voltage with said reference voltage, and then disabling said high programming-voltage generator when said comparative voltage is equal to said reference voltage.

2. An apparatus as set forth in claim 1, wherein said comparative voltage generator consists of a Look-Up-Table.

3. An apparatus as set forth in claim 1, further comprising a resistor connected between an output terminal of said high programming-voltage generator and said drain of said cell transistor.

4. A method for programming an analog semiconductor memory device, comprising:

applying a high programming-voltage of a high programming-voltage generator to a drain of a cell transistor, said cell transistor having a control gate, a floating gate and a source, and said control gate and said source being grounded during a program operation;

generating a comparative voltage corresponding to a sum of a threshold voltage and said high programming-voltage, said threshold voltage corresponding to a drain voltage of said cell transistor;

adding said high programming-voltage and an input analog voltage, and then outputting a corresponding reference voltage; and comparing said comparative voltage with said reference voltage and then disabling said high programming-voltage generator when said threshold voltage is equal to said input analog voltage.

\* \* \* \* \*

UNITED STATES PATENT AND TRADEMARK OFFICE
CERTIFICATE OF CORRECTION

PATENT NO.   : 5,761,118
DATED        : June 2, 1998
INVENTOR(S)  : Yong-Yoong Chai It is certified that error appears in the above-identified patent and that said Letters Patent is hereby corrected as shown below:

Title page,
Between the filing date and the international classification, insert the following:

-- Item [30]   Foreign Application Priority Data

Dec. 19, 1995       [KR] Republic of Korea................1995-52293 --

Signed and Sealed this

Twelfth Day of February, 2002

*Attest:*

JAMES E. ROGAN
*Attesting Officer*    *Director of the United States Patent and Trademark Office*